(12) United States Patent
Nagabushnam

(10) Patent No.: US 6,171,959 B1
(45) Date of Patent: Jan. 9, 2001

(54) METHOD FOR MAKING A SEMICONDUCTOR DEVICE

(75) Inventor: Rajan Nagabushnam, Austin, TX (US)

(73) Assignee: Motorola, Inc., Schaumburg, IL (US)

(*) Notice: Under 35 U.S.C. 154(b), the term of this patent shall be extended for 0 days.

(21) Appl. No.: 09/009,396

(22) Filed: Jan. 20, 1998

(51) Int. Cl.[7] .................................................. H01L 21/44
(52) U.S. Cl. ........................ 438/683; 438/592; 438/471; 438/649; 438/751
(58) Field of Search ...................... 438/649, 648, 438/651, 682, 683, 685, 592, 595, 750, 751, 471, 476; 156/643, 643.1

(56) References Cited

U.S. PATENT DOCUMENTS

| | | | |
|---|---|---|---|
| 5,047,367 | * 9/1991 | Wei et al. ............................. | 437/200 |
| 5,384,285 | * 1/1995 | Sitaram et al. ...................... | 437/200 |
| 5,567,651 | * 10/1996 | Berti et al. .......................... | 437/200 |
| 5,874,342 | * 2/1999 | Tsai et al. ............................ | 438/301 |
| 5,902,129 | * 5/1999 | Yoshikawa et al. ................. | 438/592 |
| 5,904,564 | * 5/1999 | Park ..................................... | 438/683 |
| 5,933,757 | * 8/1999 | Yoshikawa et al. ................. | 438/682 |

OTHER PUBLICATIONS

K. W. Choi et al., IBM Corp. 1984, IBM Technical Disclosure Bulletin, vol. 27, No. 7B, Dec. 1984, "Improved Salicide Process With Multilayer Silicide Formation", pp. 4402–4404.

* cited by examiner

*Primary Examiner*—Mahshid Saadat
*Assistant Examiner*—N. Drew Richards

(57) ABSTRACT

A process for forming a silicided MOS transistor (100) begins by providing source and drain regions (104) and (106) and a gate electrode (110). Silicon nitride spacers (116) are formed adjacent the gate electrode (110). A cobalt layer (118) and an overlying titanium layer (120) are then deposited in contact with the regions (104), (106), and (110). A rapid thermal process (130) is then used to react the titanium, cobalt, and silicon together to form silicide regions (124), (126), and (128), and intermetallic compound layers (132) and (134). The intermetallic compound layers (132) and (134) are then etched using two sequentially-performed wet etch steps (136) and (138). The resulting structure (100) has a nitride spacer (116) and field oxide regions (107) which are free from cobalt residual contamination (38).

26 Claims, 3 Drawing Sheets

METHOD FOR MAKING A SEMICONDUCTOR DEVICE

FIELD OF THE INVENTION

The present invention relates generally to semiconductor manufacturing, and more particularly to, a depositing both cobalt and titanium layers when forming cobalt silicide MOS source and drain regions to prevent or reduce unwanted residue formation on an integrated circuit (IC).

BACKGROUND OF THE INVENTION

In the integrated circuit (IC) industry, it is advantageous to form silicided or salicided source regions, drain regions, and gate electrodes to reduce series resistance and contact resistance whereby integrated circuits with greater performance can be fabricated. Once such method for forming salicided source, drain, gate electrodes in an MOS transistor is illustrated in prior art FIGS. 1–3.

FIG. 1 illustrates a prior art structure 10 which has a substrate 12. Source and drain regions 14 and 16 are formed within the substrate 12. FIG. 1 illustrates field oxide isolation regions 17 and a gate oxide 18 formed over the substrate 12. A gate electrode 20 is formed over the gate oxide 18 where the gate electrode 20 is laterally surrounded by an oxide region 22 and a dielectric spacer 24. In order to enable formation of silicide regions over the regions 14, 16, and 20, a cobalt metallic layer 26a is deposited as illustrated in FIG. 1. The cobalt layer 26a is then capped with a titanium nitride (TiN) layer 28.

The titanium nitride (TiN) layer 28 is used to cap the cobalt layer 26a for one of many reasons. First, cobalt is sensitive to oxygen ambients, and cobalt will adversely oxidize in O2 ambients whereby the titanium nitride layer 28 prevents this adverse oxidation of layer 26a. The titanium nitride layer 28 also imparts advantageous stress on the underlying layer 26a to modulate the diffusion of the cobalt species in an improved manner as compared to structures that contain no capping layer 28. Therefore, unwanted lateral diffusion of unreacted cobalt is reduced due to the presence of the capping layer 28 in the silicide process shown in FIGS. 1–3.

FIG. 2 illustrates that a thermal environment 29 is used to react the cobalt in the layer 26a with the regions 14, 16, and 20. This thermal process 29 reacts some of the cobalt in layer 26a to form cobalt silicide regions 30, 32, and 36 as illustrated in FIG. 2 and leaves behind some unreacted cobalt. Layer 26b of FIG. 2 illustrates that some cobalt from the layer 26a in FIG. 1 may remain unreacted with silicon and therefore remain overlying the structure 10. It is important to note that there is no gettering or mixing between the titanium nitride layer 28 and the cobalt layer 26a or 26b in FIG. 2 to prevent unreacted cobalt from being in contact with the oxide 17 or the spacer 24 during thermal processing 29.

FIG. 3 illustrates that an etch process is then used to remove the titanium nitride layer 28 and the unreacted cobalt layer 26b from the device 10. Since unreacted cobalt is exposed to surface portions of the silicon nitride spacer 24 and the field oxide region 17 during silicidation, some cobalt residue 38 is left on the spacer 24 and on field oxide portion 17. This residue has proven impossible to remove from the device regardless of how long etch processing and/or wet cleaning procedures are performed. Therefore, although the TiN/Co process of FIGS. 1–3 has some advantages as discussed above, the residual remains 38 of the process of FIGS. 1–3 are disadvantageous for various reasons discussed below.

The process of FIGS. 1–3 is not an optimal silicide process since the process of FIGS. 1–3 will leave behind cobalt residue 38 on the sidewall spacer 24 and over the field oxide regions 17 (see FIG. 3). A process is desired which can remove or reduce the presence of this conductive cobalt residue 38 which could otherwise cause electrical short between devices. In addition, the process of FIGS. 1–3 is also disadvantageous as the required thermal process 39 must be a low temperature one to obtain shallow silicided regions that have higher performance. Typically, the temperature used for the environment 29 can not exceed 500 degrees Celsius. Low temperature processing enables unreacted cobalt to diffuse into areas adjacent to layer 26a and cause cobalt/cobalt silicide spiking which could increase the diode leakage and/or degrade the device performance. Hence an high temperature process is required so that metal-silicon reaction dominates over the metal diffusion in silicon, while still obtaining a thin silicide.

Since the titanium nitride layer 28 and the cobalt layer 26a do not chemically interact or mix in FIG. 2, in addition to the undesirable lateral diffusion of cobalt, residual cobalt 38 is left behind on the oxide 17 and the spacer 24 as shown in FIG. 3. Therefore, the lack of cobalt gettering on the nitride 24 and oxide 17 regions, as shown in the process of FIGS. 1–3, leads to the residue formation of FIG. 3. It is important, to note that the residue 38 in FIG. 3 is most likely to be conductive in nature, and will increase capacitive coupling and leakage current between the gate electrode 20 and the source and drain regions 14 and 16. In some cases, the residue 38 may form a complete electrical short circuit between the gate electrode 20 and the source and drain regions 14 and 16. Therefore, avoidance or reduction of residue 38 is desired in a salicide process.

Furthermore, subsequent processing of the device of FIG. 3 may supply silicon atoms and/or heat to the residue 38 whereby the contamination 38 may diffuse, grow, and/or spread along the sidewall of the spacer 24 whereby short circuits between the gate 20 and the source and drain regions 14 and 16 become more likely and/or more damaging to IC yield. Due to this effect, high temperature dopant drive cycles to move dopant atoms out of a cobalt silicide layers to form shallow source and drain regions 14 and 16 cannot be used with adequate yield in FIGS. 1–3. This yield loss is due to the fact that the high temperatures used to diffuse dopant atoms would diffuse/spread the residue 38 and increase the leakage current and electrical shorts between regions 14, 16, and 20.

In addition, due to the lack of gettering and the problems discussed above, the layer 26a of FIG. 1 must be deposited very thin and as typically less than 100 angstroms in thickness. Any deposition of thin metallic materials is difficult to maintain within proper standard deviations given current deposition process chambers and technology. Therefore, a process which enables thicker deposition of cobalt layer, still obtaining a thin silicide, is more desirable.

In summary, the process of FIGS. 1–3 is disadvantageous for the reasons discussed above and a new process which reduces or avoids these disadvantages is desired in the integrated circuit (IC) industry.

As an additional point related to the process taught hereinbelow, there may be structures which contain both titanium and cobalt in a single metallic stack. However, the industry has not used a titanium-cobalt bilayer stack to perform cobalt-gettered selective salicidation where desirable complete gettering of cobalt over the spacer 24 and oxide reins 17 is accomplished along with the silicide formation process. Furthermore, gettered formation and complete subsequent removal of any titanium-cobalt/titanium-cobalt-silicon intermetallic composite material formed during the anneal is essential and a technique for enabling such removal has not been addressed by the prior art. In addition, the use of titanium-cobalt stacks to avoid the residue contamination problems discussed herein via gettering of cobalt adjacent nitride or oxide interfaces has not been identified or addressed in the prior art.

Figure 1:
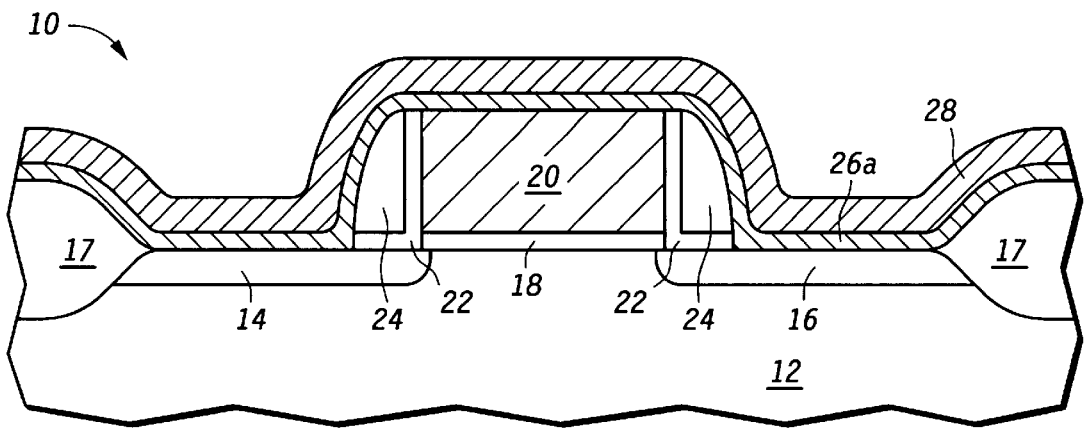
FIGS. 1–3 illustrate, in cross-sectional diagrams, a prior art process used to form silicided regions on an integrated circuit (IC).

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Description of a Preferred Embodiment

Generally, the present invention is a salicide process for forming cobalt silicide regions on both source and drain electrodes and gate electrodes of an MOS or CMOS transistor. A first metallic layer containing cobalt is deposited in contact with the source and drain regions and the gate electrode. A layer comprising titanium is then deposited on top of the cobalt layer. A rapid thermal process (RTP) is used to react the titanium with the cobalt, and to react the cobalt with underlying gate, source, and drain semiconductive material to form the silicide region in an improved manner. The gettering of cobalt due to the presence of the titanium removes unreacted cobalt from both the surfaces of oxide layers and exposed silicon nitride layers (e.g., nitride spacers) whereby the residue 38 of FIG. 3 in the prior art is avoided or significantly reduced.

Figure 3:
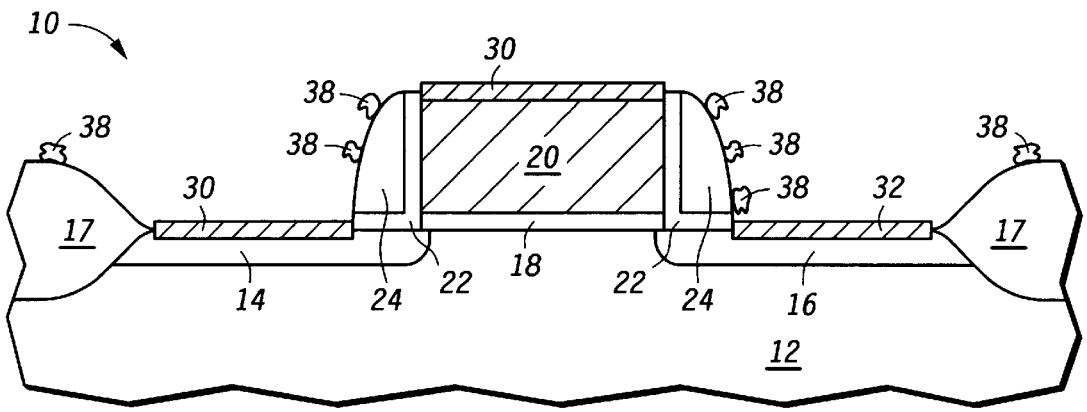

Due to the removal of the residue, less leakage current results between source and drain regions and respective gate electrodes. In addition, capacitive coupling between the three terminals of a transistor devices will be reduced. The possibility of electrical short circuiting within three terminal transistor device is also reduced whereby yield can be improved. Furthermore, the process taught herein allows for higher temperature RTP processing to be utilized for salicidation wherein adverse cobalt diffusion and cobalt spiking is reduced or avoided. The presence of the titanium, as used for cobalt gettering, ensures that lateral diffusion of cobalt is adequately controlled. Furthermore, since the residual material 38 of FIG. 3 is avoided, ultra-shallow source and drain regions can be formed using the process taught herein since implantation and thermal driving of source/drain dopant atoms from a cobalt silicide region will not adversely effect electrical isolation between gate electrodes and source and drain regions due to the lack of the residue 38 in the device taught herein. In addition, since titanium (Ti) is gettering cobalt (Co) from the surface of exposed semiconductor regions, thicker layers of cobalt can be deposited over the semiconductor substrate whereby more controlled deposition processing can be performed for integrated circuits while thin silicide regions can still be formed.

The invention can be further understood with reference to FIGS. 4–8.

Figure 4:
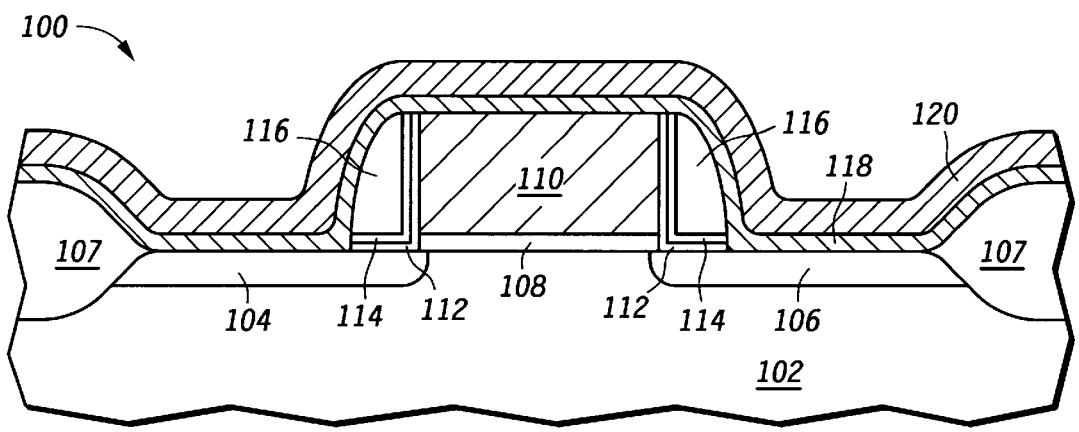
FIGS. 4–8 illustrate, in cross-sectional diagrams, a method for forming improved salicide regions in accordance with the present invention.

FIG. 4 illustrates the beginning of a process which is used to form a semiconductor device 100 which is preferably an MOS or CMOS device. Semiconductor device 100 is formed over a semiconductor substrate 102. Preferably, the semiconductor substrate 102 is made of silicon material, but any other substrate starting material, such as silicon on insulator (SOI) wafers, germanium substrates, gallium arsenide, silicon carbide, epitaxial regions, gallium nitride, silicon germanium, or a like materials may be used as a substrate herein. FIG. 4 illustrates that field isolation regions 107 are formed in selective areas of the semiconductor wafer. FIG. 4 illustrates that the regions 107 are field oxide regions formed by local oxidation of silicon (LOCOS), polysilicon buffered LOCOS (PBL), or a like isolation process. However, the field oxide isolation regions 107 of FIG. 4 may be replaced with other isolation schemes such as shallow trench isolation (STI). The field isolation regions 107 define an active area of the substrate 102 in which MOS transistors are formed. While the FIGS. 4–8 teach the silicide process with respect to MOS and CMOS devices, the invention taught herein can be used to form any active or passive electrical device on a semiconductor substrate.

FIG. 4 illustrates that source and drain regions 104 and 106 are formed within the substrate 102 by dopant ion implantation and/or thermal diffusion. In one form, the regions 104 and 106 may be formed in a non-self-aligned manner. In yet another form, the regions 104 and 106 may be formed in a self-aligned manner where an edge of the regions 104 and 106 are aligned to an edge of the gate electrode 110. The regions 104 and 106 may be lightly doped drain (LDD) regions, elevated source and drain regions, or any other like source and drain formation. In one form, the regions 104 and 106 are ion implanted and thermally activated in FIG. 4 before silicidation occurs in FIG. 5, which is the embodiment shown herein. However, in another embodiment, the source and drain regions 104 and 106 of the process of FIGS. 4–8 may not be formed until after the silicidation process is complete. In this alternate form, dopant atoms are ion implanted into the overlying silicide layer and thermally driven from the silicide into the substrate to form ultra-shallow source and drain regions 104 and 106 beneath the already-existing silicide regions. Therefore, in general, FIG. 4 illustrates that doped source and drain regions 104 and 106 are formed within the substrate 102 at some point in the IC processing.

FIG. 4 illustrates that a gate oxide layer 108 is formed overlying a surface of the substrate 102 that lies within the active area defined by the field regions 107. Layer 108 is preferably a silicon dioxide (SiO2) layer, but may be a composite dielectric layer comprising thermally grown oxide and a CVD oxide. In another form, the layer 108 may be a high-K dielectric such as silicon nitride, tantalum pentoxide, or titqnium oxide, or barium strontium titanate (BST). Layer 108 typically is in a thickness range of 15–100 angstroms of silicon-dioxide-equivalent thickness.

After formation of a gate dielectric layer 108, a blanket gate electrode 110 is deposited and patterned. Preferably, the layer 110 is formed from polysilicon which doped with a predetermined selection of dopant atoms (e.g., one or more of phosphorus, boron, arsenic, carbon, germanium, etc.). In another form, the layer 110 can be amorphous silicon, or any other semiconductive or metallic material. The layer 110 may also be a composite of one or more semiconductive and/or metallic materials.

After the gate 110 is formed, a thermal oxidation process is used to oxidize sidewall of the gate 110 and the surface of the substrate 102 to form a thermal oxide layer 112. After forming the thermal oxide layer 112, a chemical vapor deposition (CVD) process is used to deposit a tetraethylorthosilicate (TEOS) layer 114. Typically, the layer 112 is of a thickness within a range of roughly 20–100 angstroms and the TEOS layer 114 is within a thickness range of roughly 75–150 angstroms.

After formation of the layers 112 and 114, a dielectric material is deposited and reactive ion etched (RIE) to form sidewall spacers 116. In a preferred form, the sidewall spacer 116 is made of silicon nitride, however, other materials and/or composite structures may be used to form a sidewall spacer for an MOS or CMOS device. It is important to note in FIG. 4 that etch processing is used to expose a top portion of the gate 110 and a top surface of source and drain regions 104 and 106 in FIG. 4. This exposure is desired to ensure proper silicide formation on the gate, source, and drain in subsequent processing steps.

FIG. 4 illustrates that a layer containing cobalt atoms is sputter deposited over the field oxide 107, the source and drain regions 104, the gate 110, and the silicon nitride spacer 116. In one form, the layer 118 is a colbalt metal layer, while in another form, the layer 118 is a composite layer comprising cobalt. The thickness of the cobalt layer 118 is typically between 50 and 300 angstroms, and is preferably formed greater that 100 angstroms in thickness. Thicker cobalt layers 118, within the range of 100–300 angstroms, are preferred since thicker layers can be better controlled through deposition processing. The cobalt-containing layer 118 is deposited in contact with the source and drain regions 104 and 106 and the gate electrode 110 to enable salicide processing.

FIG. 4 illustrates that a titanium-containing layer 120 is deposited on top of the cobalt containing layer 118. In a preferred form, the layer 118 is a pure cobalt layer and the layer 120 is pure titanium layer, however, the layers 118 and/or 120 may be composites of one or more refractory and/or noble metals. Preferably, the titanium layer 120 is sputter deposited and formed within a range of 50 angstroms to 300 angstroms in thickness.

Figure 5:
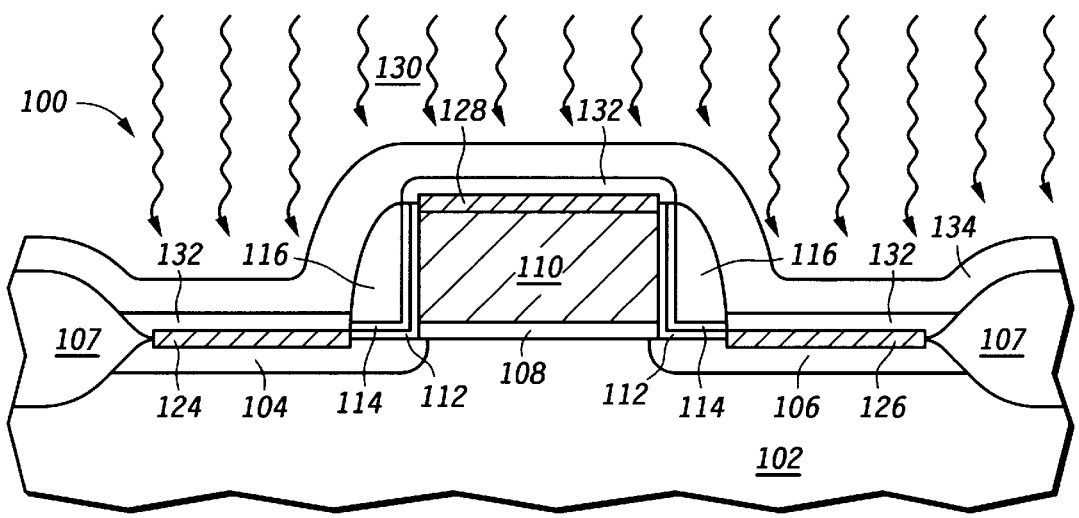

FIG. 5 illustrates that a rapid thermal process (RTP) 130 is performed on the semiconductor device 100. The environment 130 is typically an RTP environment set to a temperature within a range of roughly 500–650 degrees Celsius. The RTP process lasts for a time period roughly within 40–60 seconds. The RTP environment 130 of FIG. 5 solid state reacts the layer 120 with the layer 118 and solid state reacts the layer 118 with the exposed semiconductor areas of the gate electrode 110 and the source and drain regions 104 and 106. Specifically, the environment 130 reacts the layer 118 with the source region 104 to form a cobalt silicide region 124 in FIG. 5. In addition, the environment 130 reacts the cobalt layer 118 with the drain region 106 to form a cobalt silicide region 126. A typical thickness of the silicide regions 124 and 126 is roughly within a range of 150 angstrom to 600 angstroms. In a similar manner, the environment 130 reacts the layer 118 with a top surface of the gate electrode 110 to form a gate cobalt silicide layer 128. The thickness of region 128 is roughly similar in dimension to the thickness of layers 124 and 126.

The titanium layer 120 will solid state react with the cobalt layer 118 to perform a gettering function while the silicide regions 124, 126, and 128 are being formed. This thermally-induced reaction between the titanium, cobalt, and silicon within the device 100 will create the layers 132 and 134 in FIG. 5. In the regions adjacent to and in close proximity to the cobalt silicide regions 124, 126, and 128, a region 132 will form, where in this region is a material that is some composite of titanium, cobalt, and silicon (Ti—Co—Si). Overlying these Ti—Co—Si regions 132 will be a composite layer 134 comprising titanium and cobalt and being relatively free or entirely from silicon content. Due to the gettering or mixing between the titanium layer 120 and the cobalt layer 118 during RTP processing, no unreacted cobalt is allowed to remain in contact with the silicon nitride spacer 116 or the field oxide regions 107. Since no unreacted cobalt is in contact with these layers 116 and 107, the residual defects 38, previously illustrated for the prior art in FIG. 3, art not found in the final product 100.

Figure 2:
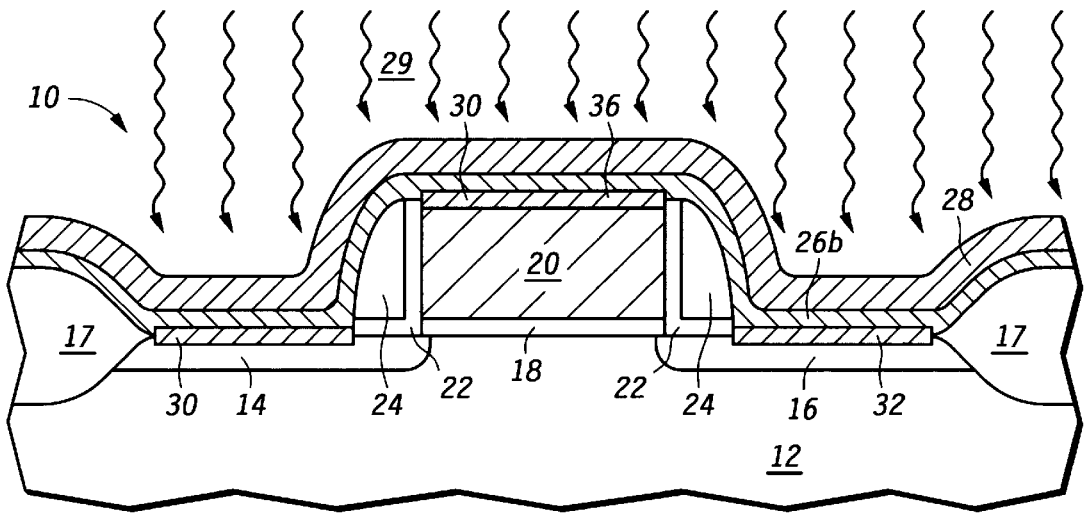

In addition, the presence of layers 118 and 120 allows a temperature of the RTP process 130 to be increased in temperature above that available in the prior art process of FIGS. 1–3. This increase in RTP temperature will avoid cobalt spiking found in the prior art, and also avoid other thermal disadvantages discussed with respect to FIGS. 1–3. In addition, since the titanium will getter cobalt away from the silicide reaction with semiconductor areas, thicker cobalt silicide layers can be deposited while maintaining a similar RTP processes time and forming the same thin silicide regions (e.g. 150–600 Angstroms).

Figure 6:
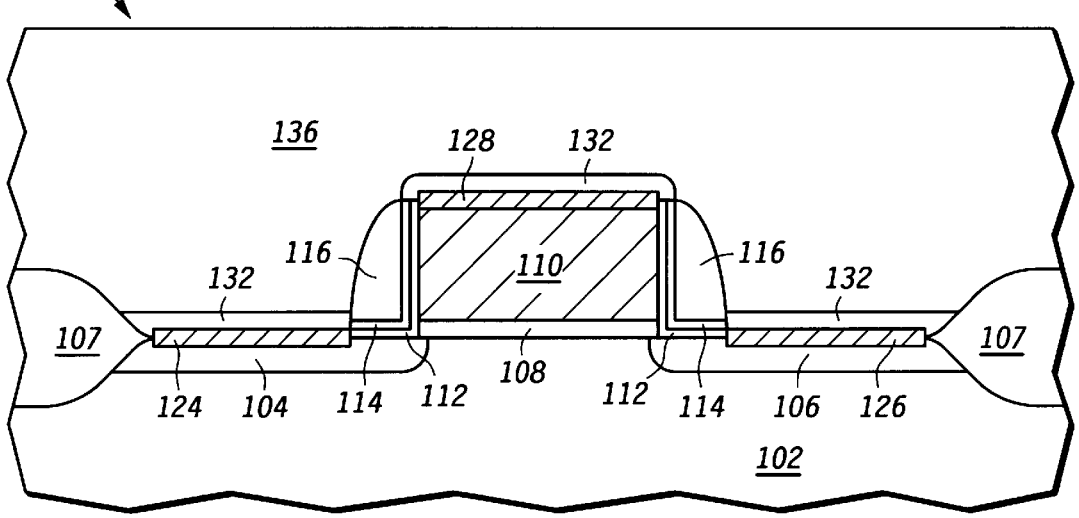

In FIG. 6, after RTP processing of the structure 100, the semiconductor structure 100 is exposed to a first wet etch chemistry 136. The wet etch chemistry 136 is provided to enable selective removal of the titanium cobalt layer 134 in FIG. 5. In a preferred form, the wet etch chemistry 136 is piranha. In a preferred form, piranha contains water ($H_2O$), hydrogen peroxide ($H_2O_2$), and sulfuric acid ($H_2SO_4$), which is typically heated to a temperature range within roughly 80 degrees Celsius to 130 degrees Celsius. Therefore, the etch environment 136 will remove the Ti—Co layer 134 selective to the field oxide 107, the titanium cobalt silicon layer 132, the silicon nitride spacer 116, and other exposed layers.

Figure 7:
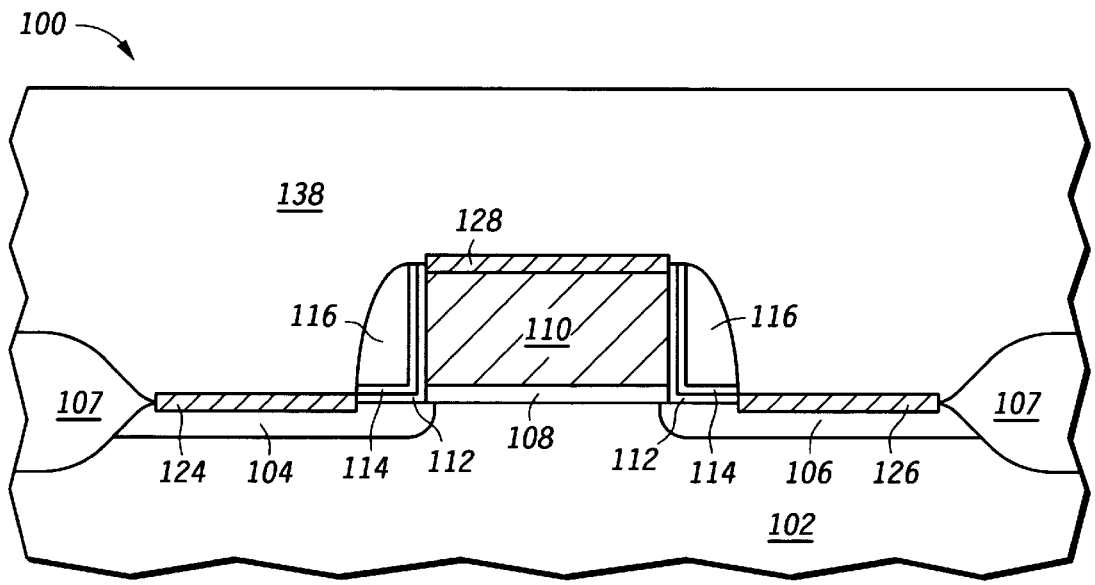

FIG. 7 illustrates that wet etching performed by the wet etch chemistry 136 is completed, and a second wet etched chemistry 138 is provided to the semiconductor device 100. The environment 138 is used to remove the titanium-cobalt-silicon regions 132 illustrated in FIG. 6. In order to effectuate this removal, the wet chemistry 138 is typically a titanium strip chemistry. In a preferred form, the chemistry 138 comprises ammonia hydroxide ($NH_4OH$), hydrogen peroxide ($H_2O_2$), and water ($H_2O$). A thermal temperature for the solution 138 is typically between room temperature and 100 degrees Celsius. An exposure time of the wafer to the environment 136 is roughly 10–30 minutes, and an exposure time of the substrate to the environment 138 is roughly 15–45 minutes. At the end of FIG. 7, all portions of the layers 134 and 132 should effectively be removed from the surface of the device 100 without adverse quantities of cobalt residue remaining on the wafers as in FIG. 3.

Figure 8:
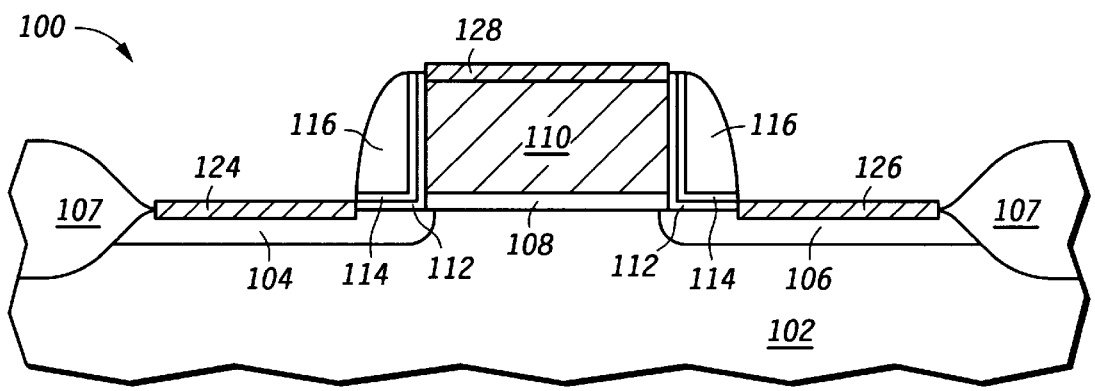

FIG. 8 illustrates the silicided three-terminal MOS transistor after wet etch chemistry removal as discussed previously with respect to FIGS. 6 and 7. As clearly illustrated in FIG. 8, no cobalt residue is left remaining on the silicon nitride spacers 116 or the field oxide 107 as previously illustrated with respect to FIG. 3. Since this residue is avoided, leakage current between the gate 110 and the source and drain regions 104 and 106 is reduced over the prior art. Capacitive coupling and electrical shorts are reduced between the three terminals of the transistor in FIG. 8, whereby IC yield is improved. In addition, all of the disadvantages previously discussed with respect to FIGS. 1–3 are either completely avoided or reduced when using the process of FIGS. 4–8.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, other refractory metals, noble metals, or composites thereof may be used herein for the layers 118 and 120 (e.g., nickel, molybdenum, palladium, etc.). Other deposition processes, such as CVD, may replace sputtering processes referenced herein. Therefore, it is intended that this invention encompass all of the variations and modifications as fall within the scope of the appended claims.

What is claimed is:

1. A method for making a semiconductor device, the method comprising the steps of:
    defining source and drain regions in a substrate;
    forming a first metal layer overlying the source and drain regions;
    forming a second metal layer overlying the first metal layer;
    heating the first and second metal layers so that the first metal layer reacts with the second metal layer to form a composite metallic layer and with the source and drain regions to form silicided regions over the source and drain regions;
    removing the composite metallic layer from the semiconductor device.

2. The method of claim 1 further comprising a step of:
    ion implanting the silicided regions with dopant atoms and thermally driving the dopant atoms from the silicided regions into the substrate to form source and drain regions for an MOS transistor.

3. The method of claim 1 wherein the step of removing further comprises:
    removing the composite metallic layer using a wet etch chemistry.

4. The method of claim 3 wherein the step of removing further comprises:
    removing the composite metallic layer using a wet etch chemistry containing sulfuric acid ($H_2SO_4$), hydrogen peroxide ($H_2O_2$), and water ($H_2O$).

5. The method of claim 4 wherein the step of removing further comprises:
    removing the composite metallic layer using a wet etch chemistry containing ammonium hydroxide ($NH_4OH$), hydrogen peroxide ($H_2O_2$), and water ($H_2O$).

6. The method of claim 3 wherein the step of removing further comprises:
    removing the composite metallic layer using a wet etch chemistry containing ammonium hydroxide ($NH_4OH$), hydrogen peroxide ($H_2O_2$), and water ($H_2O$).

7. The method of claim 1 wherein the step of heating further comprises:
    heating the first and second metal layers using a rapid thermal annealing process (RTA).

8. The method of claim 7 wherein the step of heating further comprises:
    heating the first and second metal layers using a rapid thermal annealing process (RTA) in a temperature substantially in a range of 500 to 650° C.

9. The method of claim 1 wherein the first metal layer comprises cobalt.

10. The method of claim 1 wherein the second metal layer comprises titanium.

11. The method of claim 1 wherein the first metal layer is cobalt and the second metal layer is titanium.

12. The method of claim 1 wherein the composite metallic layer differs in composition so that regions of the composite metallic layer which are adjacent the salicided regions are different from regions of the composite metallic layer which are adjacent a nitride spacer formed adjacent a gate electrode of the semiconductor device.

13. The method of claim 1 wherein the composite metallic layer comprises two regions, a first region comprising cobalt, titanium, and silicon and being adjacent the silicided regions, a second region comprising titanium and cobalt and overlying the first region.

14. The method of claim 1 wherein a gate electrode is formed between the source and drain regions and a silicon nitride spacer having a sidewall is formed adjacent the gate electrode, wherein the step of removing further comprises:
    removing all metallic residue from the sidewall of the silicon nitride spacer.

15. The method of claim 1 wherein a thickness of the first metal layer is greater than 100 angstroms.

16. A method for making a semiconductor device, the method comprising the steps of:
    forming an MOS gate electrode overlying a channel region defined in a substrate, the MOS gate electrode being formed, at least in part, by a material that may be silicided via exposure to a refractory metal;
    forming MOS source and drain areas in the substrate and adjacent the MOS gate electrode, the substrate being, at least in part a material that may be silicided via exposure to a refractory metal;
    forming a first refractory metal layer overlying the MOS gate electrode, MOS source area, and MOS drain area, the first refractory metal layer containing first refractory metal atoms;
    forming a second refractory metal layer overlying the first refractory metal layer, the second refractory metal layer containing second refractory metal atoms;
    heating the substrate so that the first refractory metal layer reacts with the second refractory metal layer to form a composite metallic layer that contains some mixture of both the first and second refractory metal atoms, the heating also reacting the first refractory metal atoms with the MOS source and drain areas to form silicided regions over the MOS source and drain areas wherein the silicided regions contain first refractory metal atoms, the heating also reacting the first refractory metal atoms with the MOS gate electrode to form a gate silicided region over the MOS gate electrode where the gate silicided region contains first refractory metal atoms, wherein after heating the substrate substantially no unreacted first refractory metal from the first refractory metal layer remains overlying the substrate; and
    removing the composite metallic layer from the semiconductor device using a wet etch process.

17. The method of claim 16 wherein a silicon nitride spacer having a sidewall is formed adjacent the MOS gate electrode whereby the second refractory metal layer getters atoms from the first refractory metal layer away from the sidewall of the silicon nitride spacer.

18. The method of claim 17 wherein the step of removing further comprises:
    removing all metallic residue from the sidewall of the silicon nitride spacer via the step of removing.

19. The method of claim 16 wherein the step of removing further comprises:

removing the composite metallic layer using a wet etch chemistry containing sulfuric acid ($H_2SO_4$), hydrogen peroxide ($H_2O_2$), and water ($H_2O$).

20. The method of claim 19 wherein the step of removing further comprises:
removing the composite metallic layer using a wet etch chemistry containing ammonium hydroxide ($NH_4OH$), hydrogen peroxide ($H_2O_2$), and water ($H_2O$).

21. The method of claim 16 wherein the step of removing further comprises:
removing the composite metallic layer using a wet etch chemistry containing ammonium hydroxide ($NH_4OH$), hydrogen peroxide ($H_2O_2$), and water ($H_2O$).

22. A method for forming a semiconductor device, the method comprising the steps of:
providing a silicon substrate;
forming a silicon-containing gate electrode over the silicon substrate, the silicon-containing gate electrode defining source and drain regions laterally adjacent the silicon-containing gate electrode;
forming a silicon nitride sidewall spacer laterally adjacent the silicon-containing gate electrode;
forming a layer containing cobalt over the silicon-containing gate electrode and over the source and drain regions;
forming a layer containing titanium over the layer containing cobalt;
heating the layer containing cobalt and the layer containing titanium at a temperature above 500° C. to: (1) form a silicide comprising cobalt at an interface between the layer containing cobalt and the gate electrode, source region, and drain region; (2) form a titanium-cobalt-silicon layer adjacent the silicide; and (3) form a titanium-cobalt composite layer above the titanium-cobalt-silicon layer and adjacent the silicon nitride sidewall spacer;
exposing the semiconductor device to a first wet etch chemistry to remove the titanium-cobalt composite layer; and
exposing the semiconductor device to a second wet etch chemistry to remove the titanium-cobalt-silicon layer whereby no cobalt residue remains on a surface of the silicon nitride sidewall spacer.

23. The method of claim 22 wherein the step of removing further comprises:
removing the titanium-cobalt composite layer using a wet etch chemistry containing sulfuric acid ($H_2SO_4$), hydrogen peroxide ($H_2O_2$), and water ($H_2O$).

24. The method of claim 22 wherein the step of removing further comprises:
removing the titanium-cobalt-silicon layer using a wet etch chemistry containing ammonium hydroxide ($NH_4OH$), hydrogen peroxide ($H_2O_2$), and water ($H_2O$).

25. The method of claim 22 wherein the step of removing further comprises:
removing the one of either the titanium-cobalt-silicon layer or the titanium-cobalt composite layer using a wet etch chemistry containing ammonium hydroxide ($NH_4OH$), hydrogen peroxide ($H_2O_2$), and water ($H_2O$).

26. A method for forming a semiconductor device, the method comprising the steps of:
forming metallic composite layer over the semiconductor device to enable silicide formation for a transistor;
removing a top portion of the metallic composite layer using an etch comprising sulfuric acid ($H_2SO_4$), hydrogen peroxide ($H_2O_2$), and water ($H_2O$); and
removing a lower portion of the metallic composite layer using an etch comprising ammonium hydroxide ($NH_4OH$), hydrogen peroxide ($H_2O_2$), and water ($H_2O$).

* * * * *

UNITED STATES PATENT AND TRADEMARK OFFICE
CERTIFICATE OF CORRECTION

PATENT NO. : 6,171,959 B1
DATED : January 9, 2001
INVENTOR(S) : Rajan Nagabushnam It is certified that error appears in the above-identified patent and that said Letters Patent is hereby corrected as shown below:

<u>Claim 16, column 8,</u>
Lines 52-54, remove "wherein after heating the substrate substantially no unreacted first refractory metal from the refractory metal layer remains overlying the substrate Signed and Sealed this Twenty-third Day of October, 2001

Attest:

NICHOLAS P. GODICI
*Acting Director of the United States Patent and Trademark Office*